Figure 1:
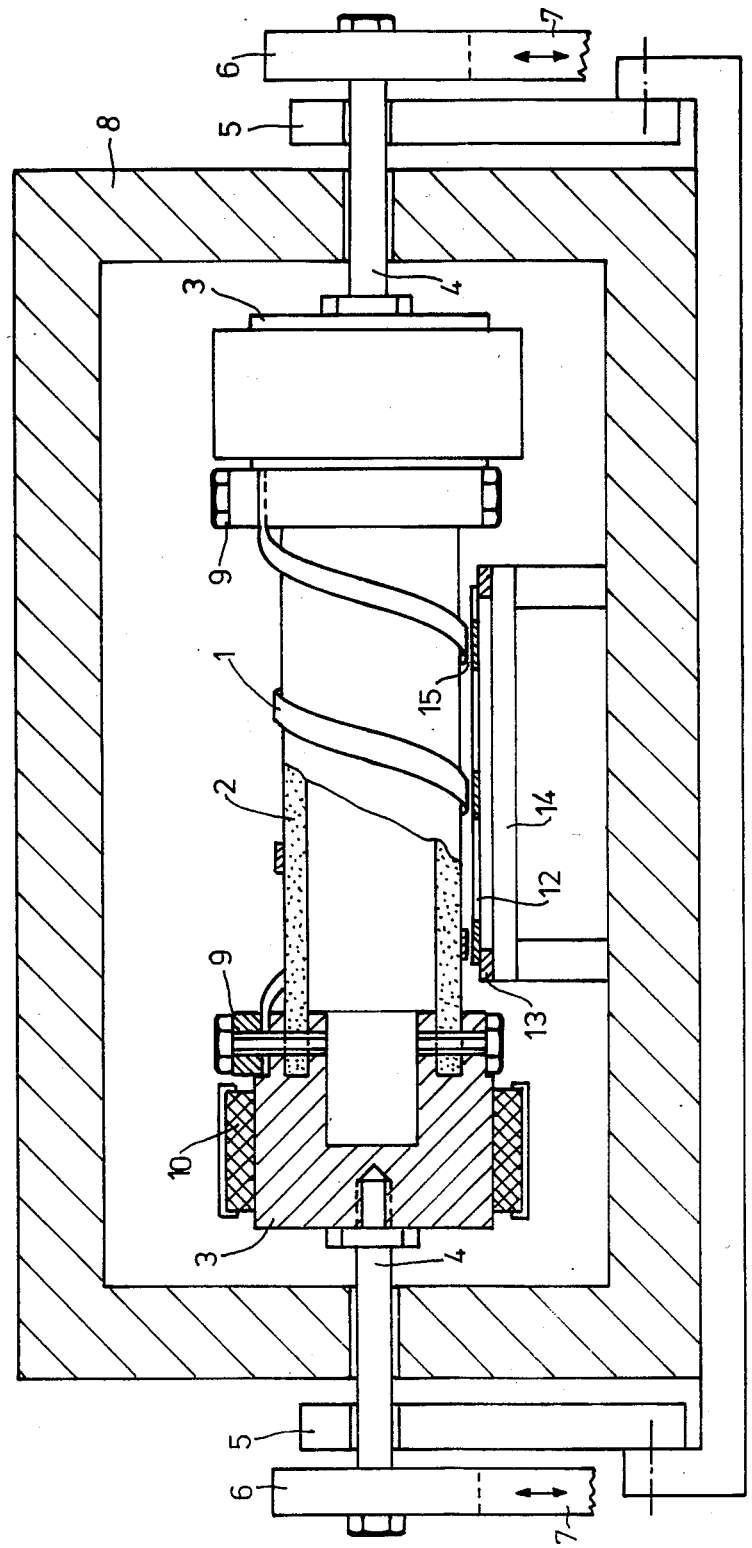

United States Patent [19]

Schwirtlich et al.

[11] Patent Number: 4,790,871
[45] Date of Patent: Dec. 13, 1988

[54] STRIP-SHAPED FILMS OF METALS, A PROCESS AND AN APPARATUS FOR THE PRODUCTION THEREOF AND THE USE THEREOF

[75] Inventors: Ingo Schwirtlich; Peter Woditsch, both of Krefeld, Fed. Rep. of Germany

[73] Assignee: Bayer Aktiengesellschaft, Leverkusen, Fed. Rep. of Germany

[21] Appl. No.: 589,612

[22] Filed: Mar. 14, 1984

[30] Foreign Application Priority Data

Mar. 31, 1983 [DE] Fed. Rep. of Germany ....... 3311891

[51] Int. Cl.[4] .............................................. C22B 9/16
[52] U.S. Cl. .................................... 75/65 ZM; 148/4; 428/610
[58] Field of Search ............. 75/65 ZM, 65 R; 148/4, 148/903; 156/617 R, 624; 428/610

[56] References Cited

U.S. PATENT DOCUMENTS

| | | | |
|---|---|---|---|
| 2,739,088 | 3/1956 | Pfann | 75/65 ZM |
| 2,855,335 | 10/1958 | Seiler et al. | 75/65 ZM |
| 3,117,859 | 11/1964 | Chandrasekhar | 75/65 ZM |
| 4,015,100 | 3/1977 | Gnanamathu et al. | 148/4 |
| 4,157,923 | 6/1979 | Yen et al. | 148/4 |
| 4,292,093 | 9/1981 | Ownby et al. | 148/4 |
| 4,309,225 | 1/1982 | Fan et al. | 148/4 |

FOREIGN PATENT DOCUMENTS 2486925 1/1982 France .
323153 12/1971 U.S.S.R. ......................... 75/65 ZM

OTHER PUBLICATIONS

Silicon Ribon Growth Using Scanned Lasers–Aslan Baghdadi, vol. 19, No. 6, dated Mar. 15, 1980.
Silicon Ribbon Growth—Bombardment–vol. 40, No. 8, dt. 4/15/82.
Journal of Applied Physics–vol. 37, No. 4. dt. 3/15/66.

*Primary Examiner*—R. Dean
*Assistant Examiner*—S. Kastler
*Attorney, Agent, or Firm*—Sprung Horn Kramer & Woods

[57] ABSTRACT

In the recrystallization and purification of a strip-shaped film of a metal or metalloid wherein one or more locally restricted melting zones are produced and are moved through the film, the improvement which comprises advancing the film, and melting it in zones which are transverse to the direction of advance of the strip-shaped film. Advantageously the film is melted by passing a current through a spirally wound coil which is placed near the film; the film is advantageously advanced in a plane so that the melt zones are diagonal relative to the film.

5 Claims, 2 Drawing Sheets

STRIP-SHAPED FILMS OF METALS, A PROCESS AND AN APPARATUS FOR THE PRODUCTION THEREOF AND THE USE THEREOF

This invention relates to strip-shaped films of metals, to a process for the crystallisation of these films and to an apparatus for carrying out the process.

Solar cells are usually produced from crystalline silicon in the form of strips or chips in a thickness of a few 100 $\mu$m.

These chips or strips may be produced by dividing a cast silicon block, by drawing films of a suitable thickness from a melt, or by sintering strips of pulverulent raw material with or without binders.

A grain enlargement of polycrystalline strips may be achieved by a heat treatment. For this purpose, in known processes the strip is moved through a zone which is at elevated temperature, without the melting point of the material being exceeded (DE-A No. 3,019,654).

In other processes which are also suitable for enlarging crystal grains, the strip is melted locally using a guided electron or laser beam (FR-A No. 2,486,925; EP-A No. 47 140; DE-A No. 3,100,818; J. of Electronic Mat Vol. 9, No. 5, 1980, 841–856).

A silicon strip may be continuously melted down in lines according to both methods. The use of electron beams presents the disadvantage that the complete arrangement must be located in a vacuum.

Furthermore, it is known that the concentration of impurities in crystals may be reduced by zone melting (EP-A No. 54 656). In this process, a melting zone which penetrates the complete cross section of a rod is guided along the rod. The foreign atoms which are in the crystal are thereby concentrated in the liquid phase according to their segregation coefficient. This process cannot be applied to the continuous purification of strips (E. Sirtl. Proc. of Photovoltaic Solar Energy Conf., Stresa 10–14 May 1982, 858 et seq), because the purification action undergoes a saturation as soon as the concentrations of the impurities in the liquid phase have reached their saturation value.

Thus, a zone purification of strips is restricted to relatively short strip lengths of a few centimeters. Only slightly longer strips may be purified in this way by repeating the method several times.

If the strip is completely melted down over its cross section, as in the case of zone melting on rods, a maximum limitation on the strip width results which is determined by the surface tension of the melt. If this value was exceeded, the melting zone would contract and thus the structure of the strip would be destroyed.

Therefore, an object of the present invention is to provide a process and an apparatus to crystallize, re-crystallize and purify continuously and economically strips or films of metals or of semiconductor materials.

The object which has been set is achieved by producing several locally restricted melting zones which are moved through the films to be purified. In this method, the melting zones have a motion component which is transverse to the drawing direction of the films.

Thus, the present invention provides a process for the recrystallization and purification of strip-shaped films of metals or metalloids, in which process one or more locally restricted melting zones are produced and are moved through the film, these melting zones having a motion component which is transverse to the drawing direction of the strip-shaped films.

One method is particularly preferred in which the strip-shaped films are moved continuously. In one particularly preferred embodiment of the present process, a heating source is guided transversely to the drawing direction of the strip-shaped films, as a result of which the melting zone passes through an angle which is greater than 0° and smaller than ±90°, preferably from 30° to 60°, to the drawing direction of the strip-shaped film or of the heating source.

The process according to the present invention is particularly advantageous for the purification of silicon or germanium films.

The longitudinal component of the movement may be effected by a transport of the strip-shaped film, and the transverse component may be effected by the movement of the heat source. The heat source may be a resistance-heated or an inductively heated coil which is positioned at a small spacing above the strip (1 to 4 mm) transversely to the principal direction thereof.

This invention also relates to an apparatus for the production of one or more melting zones which are produced adjacently, a resistance- and/or inductively-heated coil being used. This coil may consist of graphite or silicon carbide or it may be a wire or strip of high-melting material, such as molybdenum, tungsten, tantalum or niobium. These metal wires may be wound onto a carrier.

The metal or semiconductor film is melted down locally by the heat radiation of the parts of the winding close to the strip. The melting zones are stabilized by the surface tension of the material. If the heating coil is rotated about its longitudinal axis, the melting zones move parallel to the axis of the coil on the edge of the film. The direction of this movement is determined by the direction of rotation of the coil. If the film is moved through below the coil, the direction of movement of the melting zones is produced as the resultant of both directions.

The film or continuously successive chips are melted down in this manner in strip-shapes obliquely to the principal direction of movement. The interlying strips which have not been melted down may either be melted by a second similar apparatus or by a second passage of the strip, so that altogether the complete width of the strip is covered. In this manner, the strip may be completely melted down and crystallized, and a purification effect is achieved by the directed guidance of the melting zones.

After the film has undergone the process according to the present invention, it has on its surface a structure corresponding to the melting path which is characteristic of this type of treatment.

Thus, the present invention also provides strip-shaped films which are obtained according to the present process.

Compared to a process which uses a directed laser beam or electron beam. The present invention has the advantage that relatively large locally restricted melting zones may easily be produced by selecting a correspondingly wide heating coil. Melting zones obtained in this manner are restricted in their extent only by the surface tension of the melt which is responsible for the stabilization of the melting zone. Thus, melting zones of 50 mm in diameter are possible. In contrast thereto, melting zones of only a few millimeters in diameter may be produced by electron or laser beams.

Another advantage of the present process is that in order to increase the number of melting zones, it is necessary to increase only the number of turns of the heating-coil.

The result of the two advantages together is that the speed at which the strip to be crystallized passes through the present apparatus may be selected to be so low that the purification action associated with the movement of the melting zone is still fully effective from an economic point of view.

A further advantage of this process is seen in its more favorable efficiency compared to the beam of a laser or of an electron beam gun. The efficiency of this process is essentially determined by the thermal insulation of the parts of the coil which do not act on the strip-shaped film. Thus, it may be optimized accordingly. The parts of the coil which do not act directly on the film contribute to the heating of the chamber, which is well insulated thermally except for one inlet and outlet for the film, and in which this apparatus is installed. The average temperature of this chamber should be high enough so that the mechanical tensions which arise during local melting do not result in a destruction of the strip.

The consideration up until now of the process according to the present invention has proceeded from a use on metal and semiconductor strips. However, this does not constitute a limitation on the process, because a use for all materials which may be crystallized and purified by zone melting is included.

In the present process, it is possible to introduce a preferred orientation into the strip by means of a seed crystal at the beginning of the strip. The orientation would be further transmitted stripwise by melting down in an overlapping manner.

Whereas processes which use an electron beam may only be employed under a vacuum, the process according to the present invention may even be carried out in air with a suitable choice of the heating coil material.

Hitherto, the apparatus has proceeded from an arrangement in which the heating coil is positioned only on one side of the strip, that is on the top. This apparatus may be extended to thicker films, chips or strips so that a heating coil is positioned on both sides of the strip to be melted down, the speed and direction of rotation of the coils being coordinated with one another.

The holding and the transport of the strips to be crystallized during the melting-down procedure is without particular significance for the present process, as long as it is ensured that the melted regions cannot become contaminated. This requirement may be met in various ways, for example by selecting, in the case of a silicon film, a carrier body of a material which does not react with liquid silicon, such as silicon nitride, silicon carbide or graphite, or by preventing contact between the strip-guiding parts and the liquid silicon by a suitable arrangement of the supporting parts. There are various possibilities of meeting this requirement for a man skilled in the art which do not affect the inventive concept itself. Thus, the strip or the film could, for example, be guided under the heating coil so that it only rests thereon upstream and downstream of the momentary melting zone.

A further improvement of the present process may be achieved by reducing the thermal stresses between the molten regions, the solid metal or semiconductor and the carrier material. For example, according to one embodiment of the present invention, the complete strip section to be melted down is brought to a relatively high temperature before the individual melting zones are produced. The temperatures which are to be set have not proved to be very critical if they lie above 600° C., preferably above 700° C. Of course, the upper limit is set by the melting point of the silicon. In order to produce defined melting zones with the arrangement according to the present invention and in order to work as economically as possible, temperatures are preferably used which are below the sintering temperature of the metals and semiconductor materials to be crystallized.

In the case of silicon, temperatures of the strips of from 600° to 1200° C., preferably from 800° to 1000° C. have proved to be very suitable. The increase and decrease of these temperatures before or after the actual crystallization step is not critical as long as extremely high heating and cooling rates are not used. In this case, changes in temperature up to a few 100° C. per minute may be tolerated.

The strip-shaped films may be transported in various ways. The method of transport is insignificant for the crystallization process according to the present invention, as long as a regular movement speed is observed. The drawing of the strips as well as a transport via carrier devices leads to the same results with respect to the desired crystallization and purification.

Figure 2:
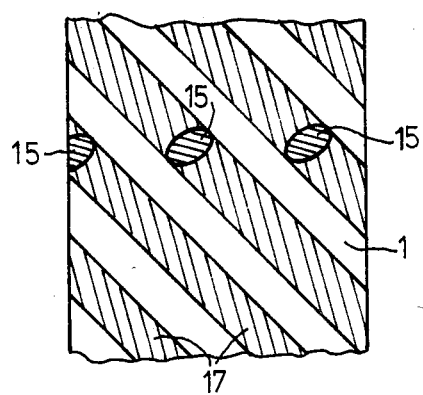

The invention will be further described with reference to the accompanying drawing, wherein:

FIG. 1 shows the apparatus for the production of locally restricted melting zones and the movement thereof through a metal film, and FIG. 2 Schematically shows the crystallization pattern which is obtained as a result of the strip-shaped melting down procedure.

The meaning of the reference numerals in FIGS. 1 and 2 is given in the following examples.

EXAMPLE 1

The apparatus which is used for crystallization comprises as shown in FIG. 1, a strip-shaped sheet (1) of molybdenum, 5 mm wide and from 0.6 to 0.8 mm thick, which is wound into a coil on a split ceramic pipe (2) having an external diameter of 32 mm.

The coil pitch is from 10 to 30 mm. The ceramic pipe is connected at each end to a rotary part 3 which allows an attachment (9) of the molybdenum sheet (1). The heating current is supplied via this rotary part which is made of copper by means of the carbon brushes (10).

The rotary parts (3) are mounted together with the coil heating (1), (2) in a holding device (5) via driving axles (4). In order to avoid the occurrence of loading torques, both half-axles are driven by a motor (not shown) by means of crown gears (6) and toothed belts (7) via an outer connection shaft (not shown). The bearings (5) and the complete driving mechanism are positioned outside a housing (8) which serves the purpose of thermal insulation. It is provided with an opening only on its front and back to deliver and remove the films to be crystallized.

This apparatus is used in order to melt down a polycrystalline silicon chip (12) having dimensions of 50 mm×50 mm×0.4 mm, in a locally restricted manner.

For this purpose, the chip rests on ceramic bars (13) which are located on another heating device (14). The bars are interrupted below the heating coil, so that no molten silicon can come into contact with these holding devices. The spacing between the heating coil (2) and the silicon chip (12) may be adjusted by the holding device (5) of the coil (2) which may be pivoted about axis (15).

The complete arrangement excluding the temperature-sensitive drive (6), (7) and the holding device (5) is surrounded by an insulating housing (8) in order to keep the energy which is to be expended as low as possible. Argon gas was used as the atmosphere. The temperature in the insulating housing (8) was increased to such an extent using the graphite heating (14) that the silicon chip was exposed to a temperature of 800° C. Thereupon the molybdenum coil was heated so strongly by the direct passage of current that the regions (15) of the silicon chip (12) close to the coil were melted down. A power of about 3 kW was necessary for this purpose. After this procedure, the coil was made to rotate (1-3 rpm) and the silicon chip was drawn through under the coil at a rate of about 3 mm/s. This resulted in a strip-shaped melting in the direction of the movement resultant (FIG. 2). The width of the strips depends on the temperature of the coil and on the resulting speed. In this experiment, a strip width of 8 mm (17) was produced. The molten regions then still exhibited only a few large crystal grains.

EXAMPLE 2

A polycrystalline silicon chip was melted locally by adapting the part (9) to a graphite coil having an external diameter of 20 mm, a wall thickness of 2 mm and a winding width of 10 mm. The coil pitch was 30 mm. A silicon chip (12) having dimensions of 50 mm×50 mm×0.4 mm was heated to 820° C. by means of the heating device (14). The spacing of the heating coil from the silicon chip was 2 mm. The operation of heating the coil using 1500 W resulted in the formation of melting zones in the regions close to the winding. By rotating the coil at from 1 to 3 rpm and by moving the silicon chip at from 1 to 3 mm/s, a strip-shaped melting-down effect was obtained as in the Example 1. In this case as well, the strip width was about 8 mm. This width could be widened to 15 mm by increasing the heating power.

EXAMPLE 3

Silicon films consisting of a suspension of finely-divided silicon powder were introduced into the unchanged apparatus of Example 2. The film width was 50 mm and the thickness was 0.2 mm. These films were held at the edges by positioning them on ceramic bars (13) in the same way as the silicon chips of the preceding examples. The films were mounted in cantilever fashion by a break in the region of the coil heating (1), so that in this case no impurities could be picked up by contact between the melt and the carrier material. After the film had been pre-heated to 400° C. by means of the heating device (14), it was melted in a locally restricted manner by the heating coil. The power necessary for this purpose amounted to about 2.3 KW.

Rotation of the coil at up to 10 rpm resulted in a strip-shaped melting, when the film was drawn through below the coil at a rate of up to 5 mm/s. After solidification, the molten strips exhibited relatively large monocrystalline regions, the size of which depended on the speed of the melting zone, on the temperature thereof and on the impurity content of the film material.

It will be understood that the specification and examples are illustrative but not limitative of the present invention and that other embodiments within the spirit and scope of the invention will suggest themselves to those skilled in the art.

What is claimed is:

1. In the recrystallization and purification of a strip-shaped film of a metal or metalloid wherein one or more locally restricted melting zones are produced and are moved through the film in paths, the improvement which comprises advancing the film relative to a helical coil having an axis at a right angle in a plane parallel to the direction of advance, and passing sufficient energy through the coil to melt the film in zones moving transverse to the direction of advance of the strip-shaped film.

2. A process according to claim 1, wherein the strip-shaped film is advanced continuously.

3. A process according to claim 1, wherein the angel between the paths of the melting zones and the coil axis is from 30° to 60° to the direction of the advance of the strip-shaped film or of the heating source.

4. A process according to claim 1, wherein the film comprises silicon or germanium.

5. A strip-shaped film produced by the process of claim 1.

* * * * *